US012041864B2

(12) United States Patent
Jung et al.

(10) Patent No.: US 12,041,864 B2
(45) Date of Patent: Jul. 16, 2024

(54) METHOD AND DEVICE FOR STORING FREE ATOMS, MOLECULES AND IONS IN A CONTACT-LESS, ALBEIT WELL-DEFINED NEAR SURFACE ARRANGEMENT

(71) Applicants: Paul Scherrer Institut, Villigen PSI (CH); UNIVERSITY OF BASEL, Basel (CH); UNIVERSITY OF HEIDELBERG, Heidelberg (DE); INSTITUTUL NATIONAL DE CERCETARE-DEZVOLTARE PENTRU TEHNOLOGII IZOTOPICE SI MOLECULARE, Cluj-Napoca (RO)

(72) Inventors: Thomas Jung, Thalwil (CH); Aisha Ahsan, Basel (CH); Sk Rejaul, Basel (CH); Mehdi Heydari, Basel (CH); Lutz H. Gade, Heidelberg (DE); Luiza Tania Buimaga-Iarinca, Cluj-Napoca (RO); Ioan Cristian Morari, Cluj-Napoca (RO)

(73) Assignees: Paul Scherrer Institut, PSI Villigen (CH); University of Basel, Basel (CH); University of Heidelberg, Heidelberg (DE); Institutul National de Cercetare-Dezvoltare Pentru Technologii Izotopice Si Moleculare, Cluj-Napoca (RO)

( * ) Notice: Subject to any disclaimer, the term of this patent is extended or adjusted under 35 U.S.C. 154(b) by 245 days.

(21) Appl. No.: 17/491,726

(22) Filed: Oct. 1, 2021

(65) Prior Publication Data
US 2023/0107661 A1   Apr. 6, 2023

(51) Int. Cl.
H10N 99/00 (2023.01)

(52) U.S. Cl.
CPC .................................. *H10N 99/05* (2023.02)

(58) Field of Classification Search
CPC .. H10N 99/05; B82Y 10/00; H01L 29/66977; H01L 29/7613; H01J 49/4245
See application file for complete search history.

(56) References Cited

U.S. PATENT DOCUMENTS 6,430,511 B1   8/2002   Tour et al.
6,870,158 B1   3/2005   Blain
(Continued)

FOREIGN PATENT DOCUMENTS

CN   106902553 B   10/2019
CN   112774736 A   5/2021
(Continued)

OTHER PUBLICATIONS

Mueller, Kathrin et al.: "Confinement properties of 2D porous molecular networks on metal surfaces", Journal of Physics: Condensed Matter Mar. 16, 2016 Institute of Physics Publishing, Bristol, GB, vol. 28, No. 15, [153003], ISSN0953-8984, http://dx.doi.org/10.1088/0953-8984/28/15/153003.

*Primary Examiner* — Raj R Gupta
(74) *Attorney, Agent, or Firm* — Laurence A. Greenberg; Werner H. Stemer; Ralph E. Locher

(57) ABSTRACT

Surface supported quantum wells with a confined surface state capture and stably confine neutral atoms and molecules in a nanometer precise environment. Depending on the physico-chemical conditions in the capturing process, the degree of occupancy, the temperature of the solid substrate, and/or the history of external stimuli like electromagnetic field pulses, these atoms, molecules or clusters assume unique configurations. The atoms or molecules are able to remain coupled to the quantum-well specific electronic state in the confinement and as such exhibit local and delocalized quantum entanglement. The capturing potential arises from (Continued)

the superposition of Pauli repulsion between the captured object and the quantum well-specific confined electronic state. This occurs within on-surface atomic or supramolecular assemblies or surface supported coordination or covalent networks.

9 Claims, 4 Drawing Sheets
(4 of 4 Drawing Sheet(s) Filed in Color)

(56) References Cited

U.S. PATENT DOCUMENTS

| | | |
|---|---|---|
| 7,154,088 B1 | 12/2006 | Blain et al. |
| 9,034,978 B2 | 5/2015 | Thalappil et al. |
| 10,186,409 B2 | 1/2019 | Youngner |
| 10,387,792 B1 | 8/2019 | Ladd et al. |
| 10,418,443 B1 * | 9/2019 | Nordquist .............. B82Y 10/00 |
| 10,755,913 B2 | 8/2020 | Kim et al. |
| 10,866,229 B2 | 12/2020 | Meng et al. |
| 10,984,976 B1 | 4/2021 | Nordquist et al. |
| 10,991,567 B2 | 4/2021 | Langridge et al. |
| 11,004,672 B2 | 5/2021 | Kovtoun |
| 11,056,332 B1 | 7/2021 | Maunz et al. |
| 2007/0040113 A1 | 2/2007 | Monroe et al. |
| 2009/0232870 A1 | 9/2009 | Srivastava et al. |
| 2013/0040862 A1 | 2/2013 | Li et al. |
| 2013/0140523 A1 | 6/2013 | Willett |
| 2019/0057855 A1 | 2/2019 | Kim et al. |
| 2019/0164959 A1 | 5/2019 | Thomas et al. |
| 2021/0013021 A1 | 1/2021 | Mizrahi et al. |
| 2021/0151613 A1 | 5/2021 | Yang et al. |
| 2021/0249582 A1 * | 8/2021 | Afzali-Ardakani .... H10N 60/01 |

FOREIGN PATENT DOCUMENTS

| | | |
|---|---|---|
| EP | 2913839 A1 | 9/2015 |
| EP | 3106427 A1 | 12/2016 |
| EP | 3787005 A1 | 3/2021 |
| JP | 2008173745 A | 7/2008 |
| JP | 2009131931 A | 6/2009 |
| JP | 2010177249 A | 8/2010 |
| JP | 2011165918 A | 8/2011 |
| WO | 0044094 A1 | 7/2000 |
| WO | 2011133143 A1 | 10/2011 |
| WO | 2013061109 A1 | 5/2013 |
| WO | 2018046905 A1 | 3/2018 |
| WO | 2018057023 A1 | 3/2018 |
| WO | 2018063206 A1 | 4/2018 |
| WO | 2018140924 A1 | 8/2018 |
| WO | 2019018544 A1 | 1/2019 |
| WO | 2019078377 A1 | 4/2019 |
| WO | 2019125348 A1 | 6/2019 |
| WO | 2019125423 A1 | 6/2019 |
| WO | 2019125500 A1 | 6/2019 |
| WO | 2021092991 A1 | 5/2021 |
| WO | 2021115411 A1 | 6/2021 |

* cited by examiner

METHOD AND DEVICE FOR STORING FREE ATOMS, MOLECULES AND IONS IN A CONTACT-LESS, ALBEIT WELL-DEFINED NEAR SURFACE ARRANGEMENT

FIELD AND BACKGROUND OF THE INVENTION

The present invention relates to a method and a device to store free atoms, molecules, and ions in a contact-less, albeit well-defined near surface arrangement.

The ability to trap atoms, clusters (i.e., groups of cohesively interacting atoms), molecules and ions in a combination of DC and AC electric fields emitted by electric leads or electromagnetic waveguides has been a key enabler for atomic, molecular and plasma physics and has been driving innovations ranging, by way of example, from plasma science, fusion energy research to physical and bio-physical chemistry by the ability to detect very small interatomic and molecular forces with optical tweezers. Recently, these activities further gained importance for their demonstrated potential towards the development of quantum devices and quantum computing.

Prominent technological innovations embrace the long-evolved history of toroidal magnetic confinements (from Russian TOKAMAKs), Quadrupole Ion (Paul) Traps (Nobel Prize 1989), optical tweezers (Nobel Prize 1997), and more. All these inventions opened up the field for further scientific discoveries and activities and triggered new technologic applications and solutions. Common to all solutions known so far is that the confinement of the trap is created by the evanescent field in the proximity of electromagnetic waveguides, by electrodes and/or magnetic coils. Confinement is therefore limited to shallow potentials and in the addressability and spatial control of the ions. Even in most recent implementations it remains difficult to keep greater numbers of ions in precisely proximal locations in space and with respect to each other. Consequently, the addressability of the individual ions within larger quantum coupled ensembles remains a challenge.

SUMMARY OF THE INVENTION

Therefore, it is the objective of the present invention to provide a method and a device for storing free atoms, molecules and ions in a well-defined near surface arrangement without the need of an evanescent field in the proximity of electromagnetic waveguides, generated by electrodes and/or magnetic coils.

With the above and other objects in view there is provided, in accordance with the invention, a device for capturing free atoms or molecules or clusters or ions in a quantum well structure. The device comprises:
 a) a support layer of a conductive or insulating material;
 b) a conductive layer deposited on said support layer;
 c) a quantum well structure fabricated on said conductive layer; said quantum well structure comprising a number of regular or irregular quantum cells forming together with the conductive layer a specific hosting quantum wave state(s); and
 d) said free atoms or molecules or clusters or ions being held contactlessly in said quantum cells by the interaction of its quantum wave state with the specific hosting quantum wave state of the respective quantum cell and/or the specific hosting quantum wave state(s) of one or more adjacent quantum cells.

The present invention therefore presents a new approach and a device to stably hold atoms, molecules, clusters and also ions in contact-less, low interacting state with spatial resolution in the fractions of a nanometer or even down to the nm range. This is achieved by confining them within the single quantum cells of the quantum well structure or the quantum well arrays implemented at the solid surface substrates. Thus, the device at hand offers:
 i) well defined quantum mechanical contact-less interaction between the hosting quantum well state(s) and the captured atoms/molecules/clusters/ions;
 ii) unprecedented addressability, sub-nm precision and long range periodicity in 1 or 2 dimensions of the quantum well structure;
 iii) local control and access for single atom/ion/molecule/cluster experiments;
 iv) the potentials are of stronger local character with considerable binding energies but still soft enough to allow for long relaxation times and to hold complex clusters and complexes; and
 v) thus, the spatial locality of the atoms/molecules/clusters/ions is well specified by the quantum well state(s).

Suitable embodiments of the present invention can be achieved when conductive layer has a thickness of at least one atom layer, said conductive layer preferably being made from Au, Ag, Bi, Cu, graphene, a semiconductor material, phosphorous and/or sulfur.

For the generation of the quantum cells within the quantum well structure the quantum well structure can be a self-assembled polymer structure, for example, from cyano, imine, imide, thiol, thiophene, di-thiocarbamate, keto, alkyl, hydroxyl, carboxyl, or any other functional coordination linker attached to e.g. porphyrines, phthalocyanines, perylenes and other acenes, pyracenes, pyrimidines or any other molecular backbone suitable to link atomic or molecular coordination centers and form quantum wells by their interaction with the electronic states in the metallic layer; said polymer structure and coordination linkers being preferably deposited by a deposition technique in vacuum, or from a fluid phase.

In order to be able to capture single free atoms in a quantum cell, the quantum well structure can form an 1D or 2D array of quantum cells; each quantum cell providing a hosting site for the captured free atom or molecule or cluster or ion. The hosting site has a size down to a sub-nm (sub-nanometer) range.

The filling of the device with the free atoms or the molecules or the clusters or the ions can be suitably achieved when the free atoms or the molecules or the clusters or the ions are deposited into the hosting sites by a vapor deposition method.

Once more in summary, the present invention demonstrates that surface supported quantum wells comprising a confined surface state capture and stably confine neutral atoms and molecules in a nanometer precise environment. Depending on the physico-chemical conditions in the capturing process and/or the degree of occupancy and/or the temperature of the solid substrate and/or the history of external stimuli like electromagnetic field pulses, these atoms, molecules or clusters assume unique configurations which have not been observed outside of the gas or plasma state. The present invention reveals that these atoms or molecules are able to remain coupled to the quantum-well specific electronic state in the confinement and as such exhibit local and delocalized quantum entanglement (add reference to the c-alkane CSS shifting figure here). The capturing potential in this specific embodiment arises from the superposition of Pauli repulsion between the captured object and the quantum well-specific confined electronic state. This occurs e.g. within on-surface atomic or supramolecular assemblies or surface supported coordination or covalent networks. The effective capturing of the atoms/molecules/ions in a contact-less arrangement is conclusively evidenced by different experiments and observations e.g. by the long term (>/~minutes) dynamicity of atoms/molecules after exciting them locally within their hosting confinements.

Other features which are considered as characteristic for the invention are set forth in the appended claims.

Although the invention is illustrated and described herein as being embodied in a method and a device to store free atoms, molecules and ions in a contact-less but well-defined near surface arrangement, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE FIGURES

The patent or application file contains at least one drawing executed in color. Copies of this patent or patent application publication with color drawings will be provided by the Office upon request and payment of the necessary fee.

DETAILED DESCRIPTION OF THE INVENTION

The present invention described hereinafter demonstrates that surface supported quantum wells comprising a confined surface state capture and stably confine neutral atoms and molecules in a nanometer precise environment. Depending on the physico-chemical conditions in the capturing process and/or the degree of occupancy and/or the temperature of the solid substrate and/or the history of external stimuli like electromagnetic field pulses, these atoms, molecules, clusters and ions assume unique configurations which have not been observed outside of the gas or plasma state. The present invention reveals that these atoms or molecules are able to remain coupled to the quantum-well specific electronic state in the confinement and as such exhibit local and delocalized quantum entanglement (see for example FIG. 6). The capturing potential in this specific embodiment arises from the superposition of Pauli repulsion between the captured object and the quantum well-specific confined electronic state as well as by the interaction with the outer border of the well. This occurs, for example, within on-surface atomic or supramolecular assemblies or surface supported coordination or covalent networks. The effective capturing of the atoms/molecules/ions in a contact-less arrangement is conclusively evidenced by different experiments and observations, for example, by the long term (>/~minutes) dynamicity of atoms/molecules after exciting them locally within their hosting confinements (see below).

For hosting sites in a range larger than single nanometer range, it can be suitable to additionally use microwaves, IR or optical quantum wells (cavities) for generating the right interactional environment for the capturing of larger molecules and clusters in the quantum wells. Since the physics of the interaction changes with the size of hosting sites and the captured objects, larger quantum wells required a field of a standing wave for the desired interaction environment for the capture.

The contactless capturing state is achieved by the specific hosting quantum state of the quantum cells within the quantum well structure. This contactless capturing state can also be achieved by an almost complete filling of the quantum well due to the attractive interaction of the captured object and the underlying quantum well structure (thus, not only Pauli repulsion). Further, the quantum cell can also provide an un-occupied electronic (positive charging) state of the electron bunching representing the quantum cell's quantum state. This may attract atoms, molecules, cluster and ions which rather get captured in this state as compared to the occupied (negative) charging state of the quantum cell.

Figure 1:
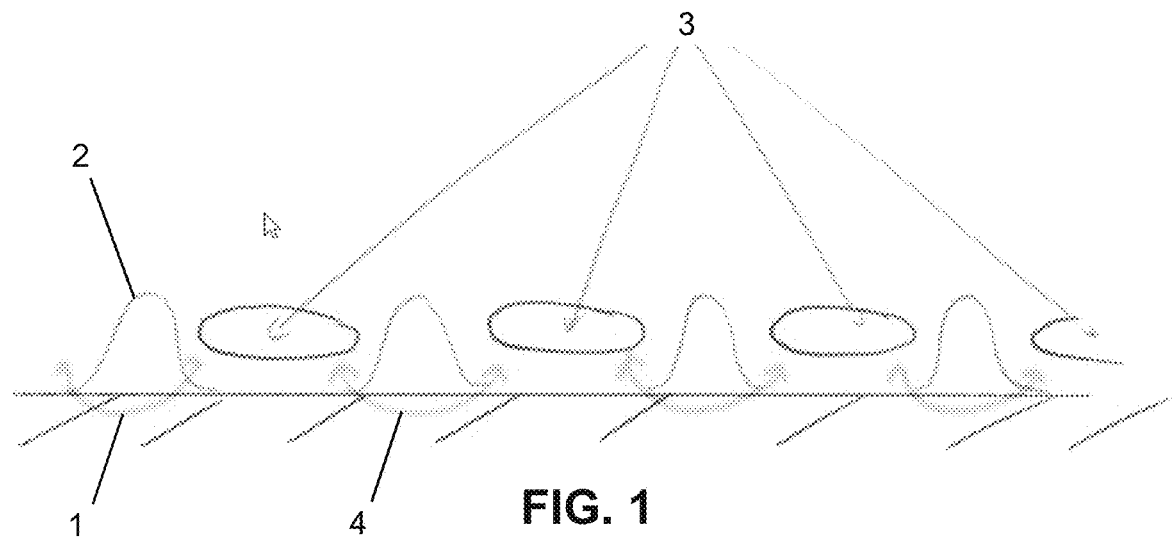
FIG. 1 is a schematic illustration of a substrate for the entanglement of free atoms, molecules and ions, where the substrate provides a network of an underlying quantum well structure for trapping atoms, clusters (groups of cohesively interacting atoms), molecules and ions.

Referring now to the figures of the drawing in detail and first, in particular, to FIG. 1 thereof, there is shown a substrate 1 for the entanglement of free atoms, molecules and ions. The substrate provides an underlying quantum well structure 2 for trapping atoms, clusters (groups of cohesively interacting atoms), molecules and ions. By an appropriate structuring technique for this substrate, for instance by self-assembly of a coordination network on metal layers or other delocalized electron containing substrates like semiconductors or graphene, electron rich or electron deficient zones 3—shown by the ellipses in FIG. 1—are formed serving as hosting quantum wells. For some functions of a device comprising these quantum wells 2, these pores can be irregularly arranged, for others it is favorable that they form 1D or 2D arrays. Depending on the system architecture a certain interaction/coupling 4 between neighboring quantum wells has been shown to exist (see the rounded arrows linking two adjacent pores).

Figure 2:
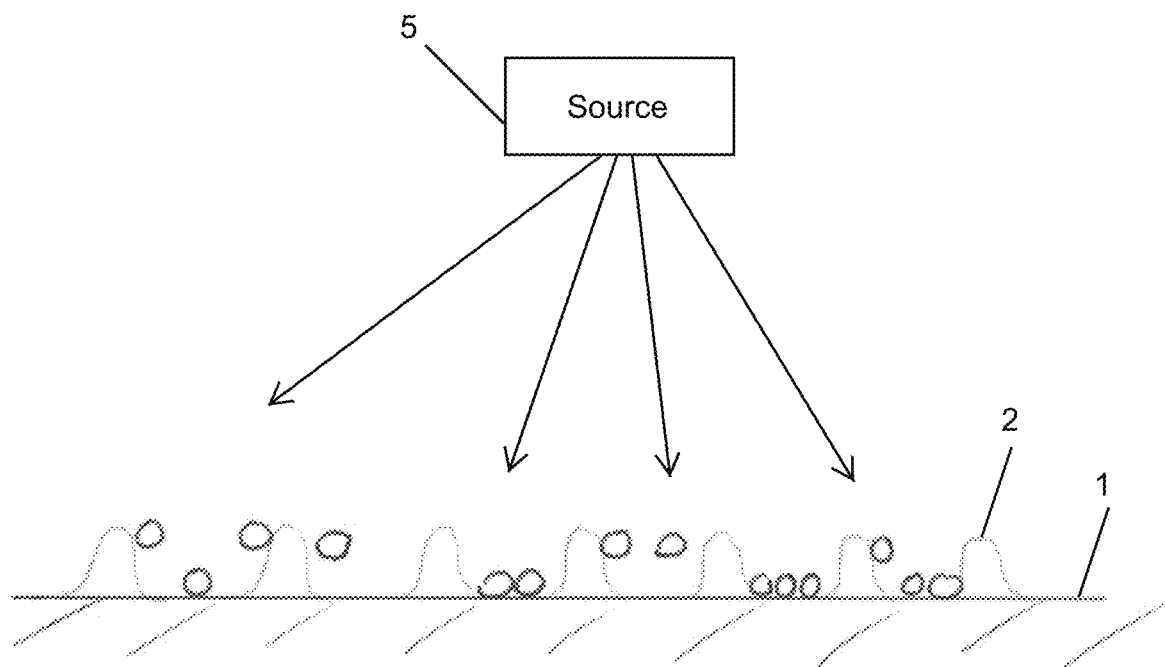
FIG. 2 is a schematic view of the network of the quantum well structure filled with free atoms, molecules, clusters and/or ions to a predetermined degree.

FIG. 2 now shows the network of the quantum well structure after filling. By deposition of atoms, clusters of atoms, ions or molecules from a source 5, the network can be filled to a variable degree. Depending on the physico-chemical properties of the deposited material and the polarity of the quantum well these are found to be supported directly (in repulsive contact) on the bottom substrate or within the electrostatic potential formed by the quantum well. It has to be noted here that the inter-quantum well coupling persists but has not been indicated in FIG. 2 as it is not essential to be present at this stage of the process.

Figure 3:
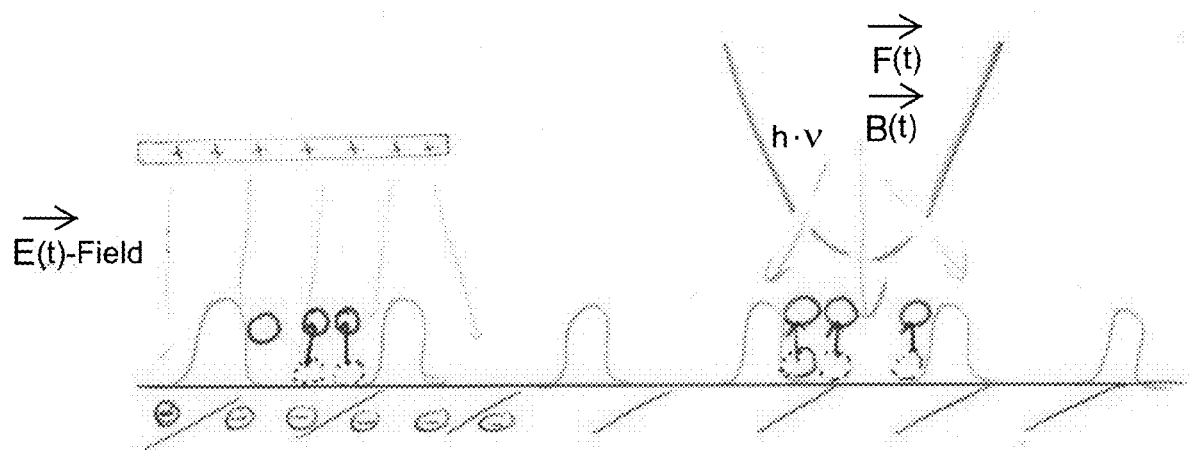
FIG. 3 schematically shows possible transitions between atoms, molecules, ions and clusters resting on the bottom quantum well substrate.

FIG. 3 schematically shows possible transitions induced upon atoms, molecules, ions and clusters in the quantum well(s). The field supported state of the same body can be induced by local or non-local stimuli in the form of, for example:
 i) applied electric and/or magnetic fields (DC and AC) (see left side of FIG. 3)
 ii) the forces, local currents and fields (DC and AC), e.g. in proximity of a stimulus e.g. a scanning probe microscopy tip (see right side of FIG. 3) or within a micro-nano fabricated device acting from below or above the quantum well network
 iii) local temperature excursions induced by dissipative processes in one or the other above; or
 iv) processes induced by electromagnetic waves in the far field of the emitter or locally in the evanescent field of a suitable waveguide.

Figure 4:
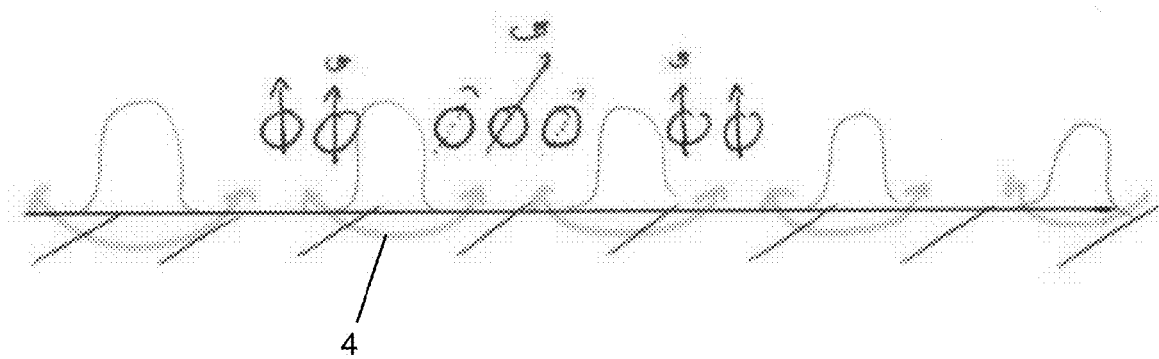
FIG. 4 schematically shows the behavior that the atoms, molecules, clusters and ions captured in the quantum wells exhibit excitable internal degrees of freedom.

FIG. 4 schematically illustrates that the atoms, molecules, clusters and ions captured in the quantum wells exhibit excitable internal degrees of freedom (giving rise to its quantum states) and weakly couple via the bottom substrate to neighboring quantum well states and objects captured therein. Read/write processes as exemplified in FIG. 3 provide either direct access to the quantum state of individual objects and/or via their interaction with neighboring quantum states and the objects contained therein. Specific functional patterns can be fabricated for instance within 2D quantum well arrays which i.e. enable a broad range of applications for quantum technology like sensors and/or quantum computing devices.

In summary, the trapping of atoms, molecules, clusters and ions in the surface supported network of quantum wells (quantum wells architectures) is distinctly different from the trapping of similar entities in static or dynamic electromagnetic fields.

The device at hand offers:
 i) well defined quantum mechanical contact-less interaction between the hosting quantum well state(s) and the captured atoms/molecules/clusters/ions;
 ii) unprecedented addressability, sub-nm precision and long range periodicity in 1 or 2 dimensions;
 iii) local control and access for single atom/ion/molecule/cluster experiments;
 iv) the potentials are of stronger local character with considerable binding energies but still soft enough to allow for long relaxation times and to hold complex clusters and complexes; and
 v) thus, the spatial locality of the atoms/molecules/clusters/ions is well specified by the quantum well state.

Figure 5:
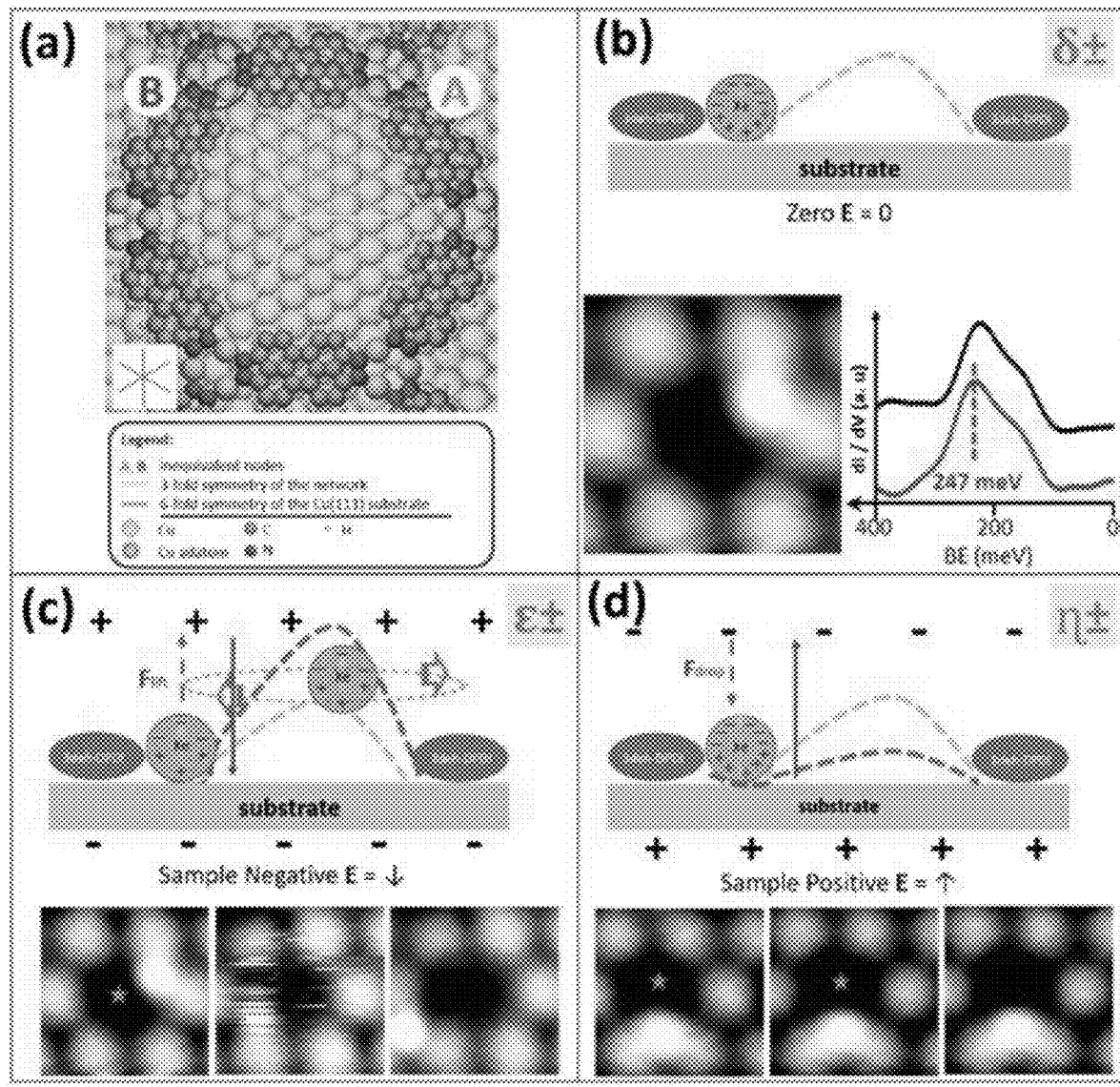
FIG. 5 schematically shows a local field induced phase transition in quantum wells.
Figure 6:
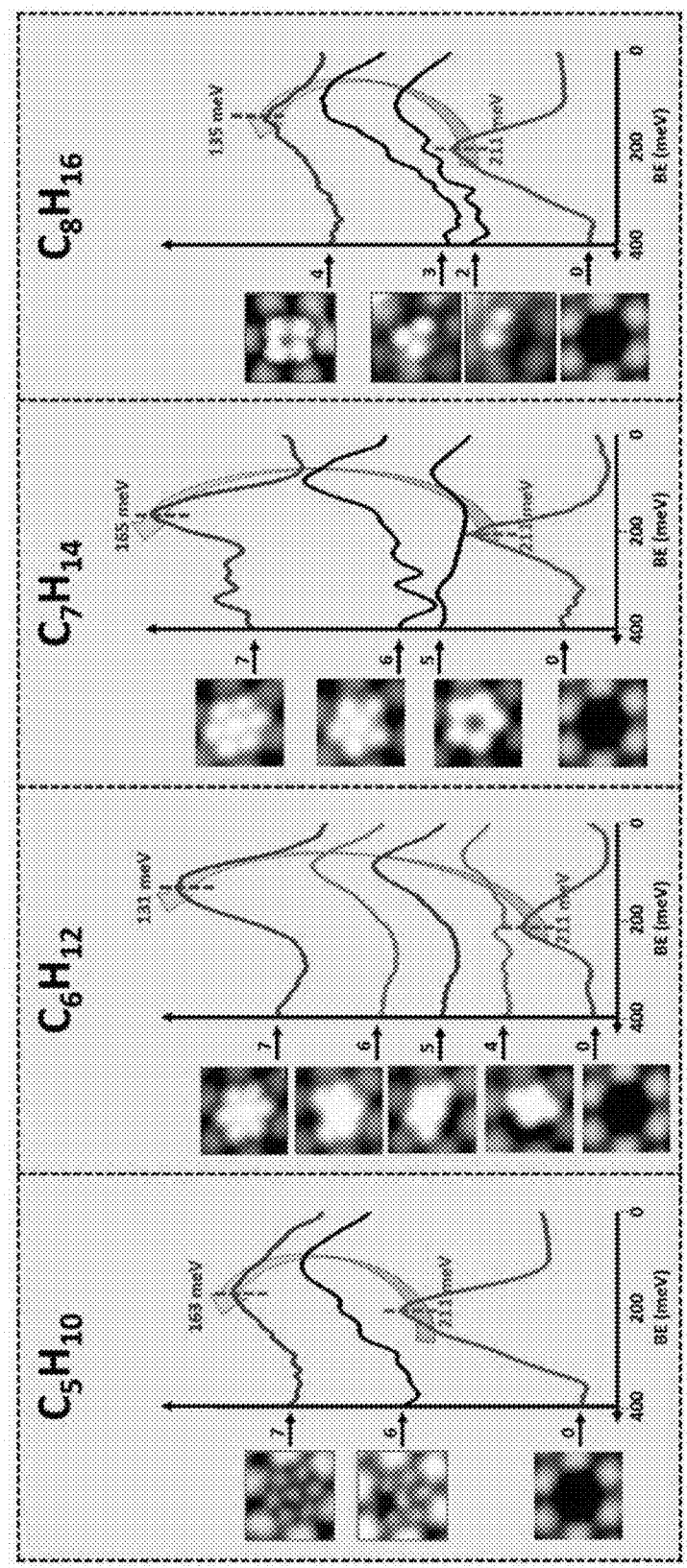
FIG. 6 is a schematic view evidencing contact-less states at higher occupancy from the back-shifting of the quantum well state.

In the following, experimental evidence/examples for contact-less capturing of e.g. atoms, molecules and clusters in quantum wells is shown in FIG. 5 and FIG. 6.

FIG. 5 shows a local field induced phase transition in quantum wells. Part (a) shows a model of the atomic structure of a quantum well formed by a perylene derived coordination network. Part (b) (top) is a schematic representation of a single Xe atom resting on the bottom substrate of the pore. Note that the brown dashed line indicates the electron density within the quantum well as measured by dI/dV scanning tunneling spectroscopy. Part (b) (bottom left) represents a single Xe atom imaged by Scanning Tunneling Microscopy as it resides in the corner position within the quantum well. Part (b) (bottom right) shows the electron density in the quantum well, as measured by scanning tunneling spectroscopy of the empty quantum wells (red line) and modified by single Xe occupation (black line). Parts (c) and (d), top, of FIG. 5 show a schematic drawing of the local field induced transitions between Xe atoms resting on the bottom substrate and the contact-less mode (c)—and back (d). Part (c) (bottom) illustrates a quantum well containing a single Xe atom mapped before, and after lifting of the Xe atom in a contact-less mode by a local electric field (sample negative bias) applied for 300-2000 msec.

Part (c) of FIG. 5, bottom right, illustrates after a few minutes of relaxation that the Xe atom relocates to an again fixed position on the quantum well coordination network. Part (d) (bottom left) shows the Xe atom resting in immobile, bottom substrate supported state before and after applying a local electric field in reverse direction (sample positive bias). Part (d) (bottom center) reversely, upon applying a voltage ramp with a peak voltage of +3 V to the sample, the initially fixed Xe atoms remain in contact with the bottom substrate as shown in Part (d) (bottom center). The blue asterisks indicate the position of the STM tip as the voltage ramps are applied. Note that the tip radius has been estimated from Field Ion Microscopy studies. (Experimental parameters: STM images size 3 nm2, tunnelling parameters: I=10 pA, V=1V; STM pulse parameters I=10 pA, V=1000 mV, Voltage ramp (b) −3V and (d) +5 V).

FIG. 6 shows an example for evidencing contact-less states at higher occupancy from the back-shifting of the quantum well state. Topographic scanning tunneling micrographs (2.4 nm×2.4 nm) of quantum wells filled with different numbers of different c-alkane molecules (cf sum formula and numbers above arrows). To the right side of the images the electron density distribution of the quantum well has been plotted. With initially increasing occupancy the Pauli repulsion between the molecules and the underlying quantum well state a gradual shift towards higher binding energies occurs (i.e. towards the Fermi Energy EF). There is a remarkable non-linearity in this shifting: Above a certain filling level (condensate size) the quantum well state shifts back in the direction of the native (empty) pore. This unexpected behavior provides further evidence for a contact less state of the cycloalkanes present at higher filling level of the quantum well.

The invention claimed is:

1. A device for capturing free atoms or molecules or clusters or ions in a quantum well structure, comprising:
 a) a support layer of a conductive or insulating material;
 b) a conductive layer deposited on said support layer; and
 c) a quantum well structure fabricated on said conductive layer, said quantum well structure comprising a plurality of regular or irregular quantum cells forming together with the conductive layer a specific hosting quantum wave state or states;
 d) wherein the free atoms or molecules or clusters or ions are held contactlessly in said quantum cells by an interaction of the quantum wave state with the specific hosting quantum wave state of the respective quantum cell and the specific hosting quantum wave state or states of one or more adjacent quantum cells, without an evanescent field in the proximity of electromagnetic waveguides, generated by electrodes and/or magnetic coils.

2. The device according to claim 1, wherein said conductive layer has a thickness of at least one atom layer.

3. The device according to claim 2, wherein said conductive layer is a metallic layer.

4. The device according to claim 2, wherein said conductive layer is formed of at least one material selected from the group consisting of Au, Ag, Bi, Cu, graphene, a semiconductor material, sulfur, and phosphorous.

5. The device according to claim 1, wherein said quantum well structure is a self-assembled polymer structure.

6. The device according to claim 5, wherein said polymer structure is assembled from cyano, imine, imide, thiol, thiophene, di-thiocarbamate, keto, alkyl, hydroxyl, carboxyl, or any other functional coordination linker attached to porphyrines, phthalocyanines, perylenes and other acenes, pyracenes, pyrimidines or any other molecular backbone suitable to link atomic or molecular coordination centers and form quantum wells by their interaction with electronic states in said conductive layer.

7. The device according to claim 6, wherein said polymer structure and coordination linkers are deposited by a deposition technique in vacuum, or from a fluid phase.

8. The device according to claim 1, wherein said quantum well structure forms an 1-dimensional (1D) or 2-dimensional (2D) array of quantum cells; each quantum cell weakly interacting with its nature and providing a hosting site for a captured free atom or molecule or cluster or ion, and said hosting site having a size down to a sub-nanometer range.

9. The device according to claim 1, wherein the free atoms or the molecules or the clusters or the ions are deposited into the hosting sites by a vapor deposition method.

\* \* \* \* \*